United States Patent
Benaben et al.

(10) Patent No.: US 10,598,725 B2
(45) Date of Patent: Mar. 24, 2020

(54) INTEGRATED CIRCUIT WITH AUXILIARY ELECTRICAL POWER SUPPLY PINS

(71) Applicants: CONTINENTAL AUTOMOTIVE FRANCE, Toulouse (FR);
CONTINENTAL AUTOMOTIVE GmbH, Hannover (DE)

(72) Inventors: Cedric Benaben, Toulouse (FR);
Didier Lascombes, Eaunes (FR)

(73) Assignees: CONTINENTAL AUTOMOTIVE FRANCE, Toulouse (FR);
CONTINENTAL AUTOMOTIVE GMBH, Hannover (DE)

( * ) Notice: Subject to any disclaimer, the term of this patent is extended or adjusted under 35 U.S.C. 154(b) by 114 days.

(21) Appl. No.: 15/425,431

(22) Filed: Feb. 6, 2017

(65) Prior Publication Data

US 2017/0227601 A1  Aug. 10, 2017

(30) Foreign Application Priority Data

Feb. 8, 2016 (FR) ..................................... 16 50980

(51) Int. Cl.
*G01R 31/00* (2006.01)
*G01R 31/28* (2006.01)
*G06F 1/26* (2006.01)
*G01R 31/27* (2006.01)
*G01R 31/317* (2006.01)

(52) U.S. Cl.
CPC ......... *G01R 31/2884* (2013.01); *G01R 31/27* (2013.01); *G01R 31/31701* (2013.01); *G06F 1/263* (2013.01)

(58) Field of Classification Search
USPC ................................ 324/713, 764.01, 762.03
See application file for complete search history.

(56) References Cited

U.S. PATENT DOCUMENTS 5,184,162 A    2/1993  Saitoh et al.
2002/0186037 A1*  12/2002  Eldridge .......... G01R 31/31721
                                                      324/754.07

(Continued)

FOREIGN PATENT DOCUMENTS

CN       1377089 A       10/2002
CN       1532934         9/2004

(Continued)

OTHER PUBLICATIONS

FR Search Report, dated Sep. 30, 2016, from corresponding FR application.

*Primary Examiner* — Vincent Q Nguyen
(74) *Attorney, Agent, or Firm* — Young & Thompson

(57) ABSTRACT

Disclosed is an integrated circuit (1) including two electrical power supply terminals (2a, 2b), respectively positive and ground, forming part of a first electrical power supply system (2) internal to the integrated circuit and providing its electrical power supply using an electrical power supply source external to the integrated circuit. The integrated circuit includes two pins (3a, 3b), respectively positive and ground, forming part of a second electrical power supply system (3) and providing an auxiliary electrical connection of the integrated circuit with the outside, the second power supply system being in parallel with the first power supply system, the first power supply system being open when the second power supply system is closed and vice versa.

20 Claims, 2 Drawing Sheets

(56) References Cited

U.S. PATENT DOCUMENTS

| | | |
|---|---|---|
| 2003/0115528 A1 | 6/2003 | Tanaka et al. |
| 2004/0222812 A1 | 11/2004 | Frankowsky et al. |
| 2013/0141124 A1 | 6/2013 | Dale et al. |
| 2014/0265629 A1 | 9/2014 | Gazit et al. |
| 2016/0329658 A1* | 11/2016 | Wilcox .............. H01R 13/6205 |

FOREIGN PATENT DOCUMENTS

| | | |
|---|---|---|
| CN | 103135048 | 6/2013 |
| JP | H04 283673 A | 10/1992 |
| JP | H06 309475 A | 11/1994 |

* cited by examiner

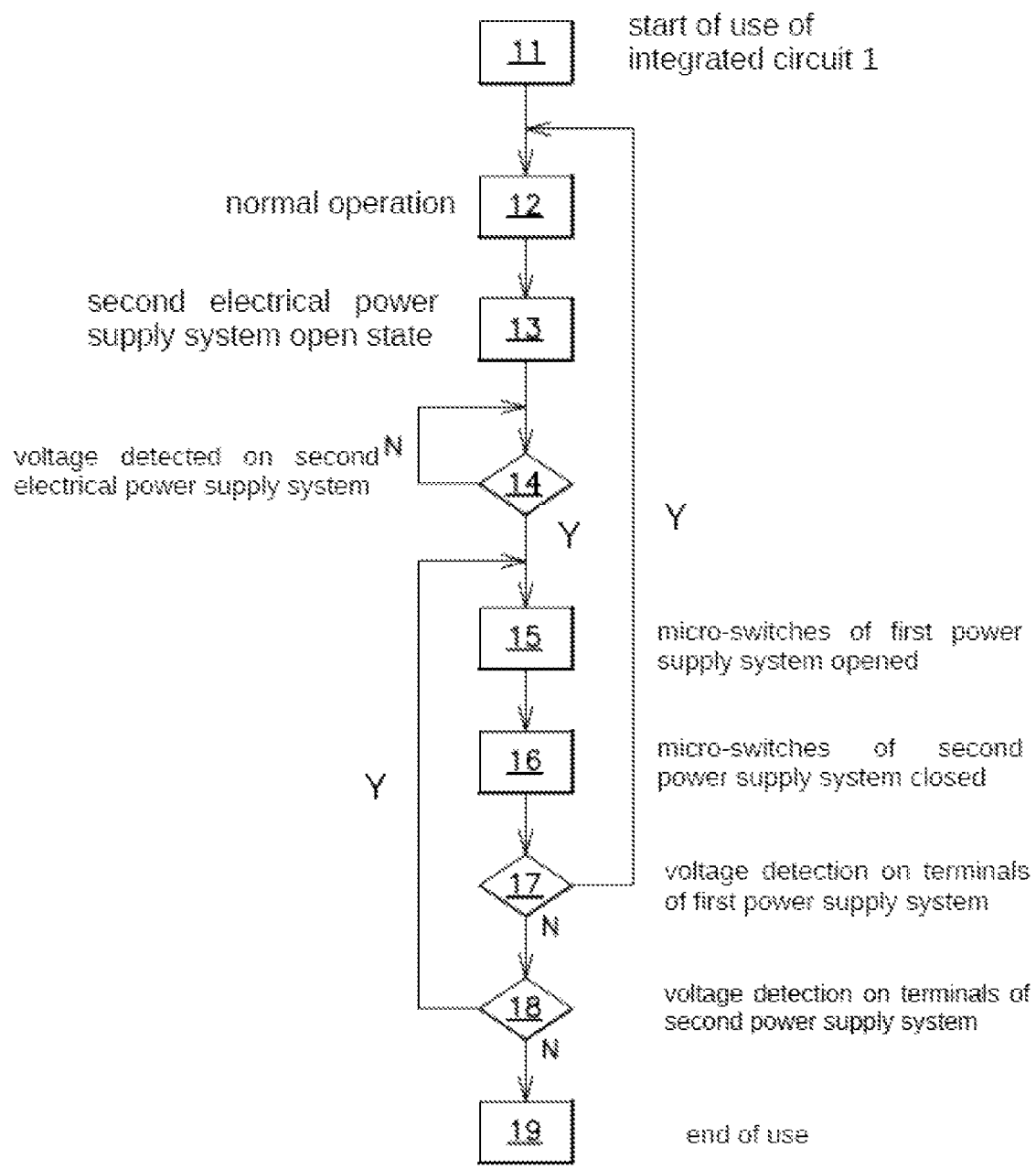

INTEGRATED CIRCUIT WITH AUXILIARY ELECTRICAL POWER SUPPLY PINS

FIELD OF THE INVENTION

The present invention relates to an electronic component of the integrated circuit type, notably but not necessarily an integrated circuit of the type referred to as a client- or application-specific integrated circuit, the latter terminology giving rise to the acronym ASIC. In one preferred application of the invention, the electronic component is soldered onto an electronic board and undergoes a verification check without it being unsoldered from the board.

BACKGROUND OF THE INVENTION

Conventionally, such an integrated circuit comprises two electrical power supply terminals—positive and ground, respectively—forming a part of a first electrical power supply system providing the connection with a main external electrical power supply of the integrated circuit.

In the specific and non-limiting case of an application-specific integrated circuit, an integrated circuit of this type allows a customization of its operation according to the use desired by a client by grouping a large number of individual and/or specifically designed functionalities. It thus differs from the standard and fixed integrated circuits which can be supplied by manufacturers with no prior customization to the requirements of the client.

It is common practice for an integrated circuit to undergo diagnostic testing prior to its operational deployment. This is frequently done when this circuit is integrated into an electronic board. The integration of such a circuit onto a board is usually done by soldering of the ends of electrical connections or terminals of the circuit onto an electrical power supply source external to the circuit.

Thus, the aim is to subject the integrated circuit to a test for verification of its correct operation. The test procedure involves the use of its electrical connections for transmitting stimulation pulses produced from a testing apparatus comprising a stimulation pulse generator designed to stimulate the circuit by sending to the integrated circuit successive pulses according to a predetermined cycle. The testing device comprises means for collecting the responses from the integrated circuit to the predetermined cycle of pulses.

The means for collecting responses from the integrated circuit to the predetermined cycle of pulses allow it to be ensured that the integrated circuit responds correctly, within an acceptable time period, to the pulses transmitted to the circuit by the simulation pulse generator.

According to the prior art, in order to test the operation of an integrated circuit, it is necessary to unsolder its electrical contact terminals with the external power supply source in order to connect it to the pulse generator. This is a difficult operation which can damage the integrated circuit or degrade its electrical connections which must be re-soldered.

The unsoldering operation is rendered difficult owing to the proximity of several other contact pins and numerous tracks of the integrated circuit or of other elements mounted on the electronic board. Termination pads are often used and these pads may be torn off during the unsoldering of the electrical connection terminals.

For example, during a conventional unsoldering operation, the sectioning of the cable linking each terminal to a power supply source external to the integrated circuit may be carried out in order to open up a larger working space. It is possible for one end of a cable to remain soldered to the terminal. In this case, this cable end is detached from the terminal by unsoldering while at the same time pulling on this end. The potential remaining solder on each terminal must then be removed in order to best free up this terminal.

In the worst case scenario, an unsoldering of an integrated circuit on an electronic board may result in damage to this integrated circuit.

Re-soldering of the terminals may also result in a faulty electrical connection between the terminals and the power supply source external to the integrated circuit.

The problem on which the present invention is based is to be able to test an integrated circuit rigidly attached by soldering to an external electrical power supply source without having to unsolder its electrical power supply connections with the external source.

SUMMARY OF THE INVENTION

For this purpose, the present invention relates to an integrated circuit comprising two electrical power supply terminals, respectively positive and ground, forming part of a first electrical power supply system internal to the integrated circuit and providing its electrical power supply using an electrical power supply source external to the integrated circuit, being noteworthy in that it comprises two pins, respectively positive and ground, forming part of a second electrical power supply system providing an auxiliary electrical connection of the circuit with the outside, the second system being in parallel with the first system, the first system being open when the second system is closed and vice versa.

The technical effect owing principally to the addition of two pins onto an integrated circuit is that a second power supply system of the integrated circuit is obtained isolated from the first power supply system used to power the circuit. In the preferred application of the present invention, which includes the use of the second power supply system for performing a diagnostic test on the integrated circuit by sending referenced stimulation pulses to the circuit, via the second system and its pins, the problems linked to the environment of the integrated circuit are avoided, given that the second power supply system is then specifically dedicated to the diagnostic test.

There is no longer any need to disconnect the terminals of the first power supply system from the external source for supplying power to the integrated circuit so as to bring it into contact with the testing apparatus. This represents a time saving because such a disconnection is difficult to implement. This also prevents the integrated circuit, and notably its power supply terminals, from potentially being damaged during this disconnection and avoids the connection to be re-established after diagnostic testing from then potentially being faulty.

Advantageously, each terminal or pin of the first and second systems is connected via a respective electrical connection comprising a micro-switch to the rest of the first and second systems, the micro-switches of the first system being in the open position when the micro-switches of the second system are in the closed position and vice versa.

Advantageously, the integrated circuit is equipped with means for detecting a voltage across the pins of the second electrical power supply system, with means for setting the micro-switches of the first electrical power supply system to the open position and with means for setting the micro-switches of the second electrical power supply system to the closed position as soon as a voltage is detected on the pins of the second electrical power supply system.

Advantageously, the integrated circuit is equipped with means for detecting a voltage across the terminals of the first electrical power supply system, means for setting the micro-switches of the second electrical power supply system to the open position and means for setting the micro-switches of the first electrical power supply system to the closed position as soon as a voltage is detected across the terminals of the first electrical power supply system.

The invention also relates to an electronic board, being noteworthy in that it comprises at least one such integrated circuit.

The invention also relates to a method for testing such an integrated circuit or an integrated circuit accommodated within such an electronic board, test stimulation pulses being sent by a testing apparatus to the integrated circuit, the testing apparatus being electrically connected to the integrated circuit during the test, being noteworthy in that the testing apparatus is electrically connected to the integrated circuit via the second power supply system parallel to the first power supply system, the first power supply system being maintained in the open position.

In the preferred embodiment, the method advantageously comprises the following steps:
  connection of a testing apparatus to the pins, respectively positive and ground, of the second electrical power supply system,
  opening of the first electrical power supply system and closing of the second electrical power supply system as soon as this connection is made,
  implementation of the test by sending stimulation pulses from the testing apparatus to the integrated circuit via the second electrical power supply system,
  after completion of the test, opening of the second electrical power supply system,
  disconnection of the testing apparatus from the pins, respectively positive and ground, of the second electrical power supply system, and
  closing of the first electrical power supply system.

The invention also relates to a test device for the implementation of such a method, the device comprising a stimulation pulse generator sending the stimulation pulses to the integrated circuit, means for receiving the responses from the integrated circuit following the stimulation pulses, being noteworthy in that it comprises electrical contact means in the form of a contact mechanism carried by the apparatus positioning itself on each pin or of a wire soldered to each terminal and connected to the pulse generator.

Advantageously, each contact mechanism takes the form of a clip equipped with two jaws gripping between them a respective pin of the second electrical power supply system of the integrated circuit.

BRIEF DESCRIPTION OF THE DRAWINGS

Other features, aims and advantages of the present invention will become apparent upon reading the detailed description that follows and with regard to the appended drawings presented by way of non-limiting examples and in which:

FIG. 3 shows a flow diagram detailing the various steps of a method for testing an integrated circuit according to the present invention.

DETAILED DESCRIPTION OF THE INVENTION

Figure 1:
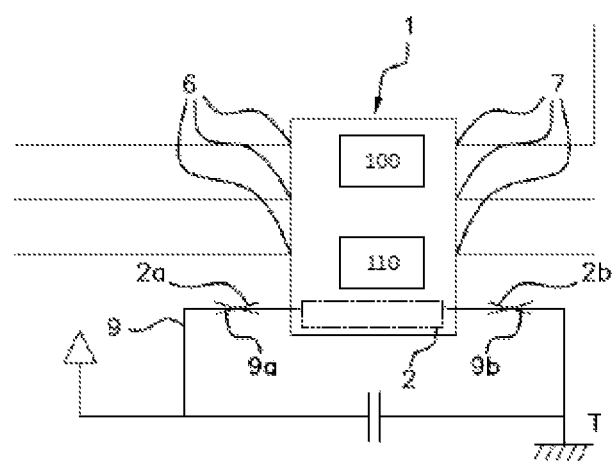
FIG. 1 is a schematic representation of an integrated circuit according to the prior art, where the electrical power supply from the outside of this integrated circuit needs to be unsoldered with a view to testing the integrated circuit prior to its initial power-up.
Figure 2:
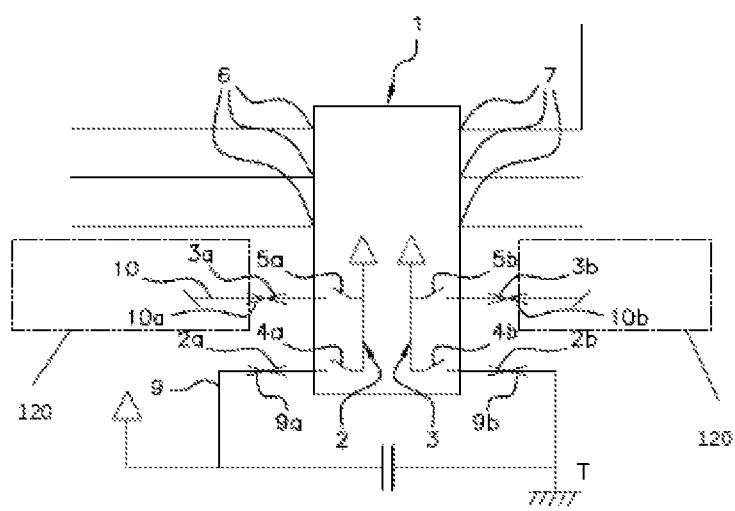
FIG. 2 is a schematic representation of an integrated circuit according to one non-limiting embodiment of the present invention, the electrical power supply of the integrated circuit and its electrical power supply designed to be connected to a testing apparatus being different and placed in parallel within the integrated circuit, the electrical power supply being suspended when a test is undertaken and, conversely, the electrical power supply connected to the testing apparatus being suspended during normal operation of the integrated circuit.

With reference to FIGS. 1 and 2, for the features that are common to the integrated circuits according to the prior art and the present invention, an integrated circuit 1 comprises two electrical power supply terminals 2a, 2b, respectively positive and ground, forming part of a first electrical power supply system 2 internal to the integrated circuit 1 and providing the main electrical power supply of the integrated circuit 1 using an electrical power supply source external to the integrated circuit 1.

The external electrical power supply source may be a battery. Depending on the integrated circuit 1 to be powered, this battery may be chosen to deliver a specific voltage, for example 5 or 3.3 Volts. Such an integrated circuit 1 usually forms part of an electronic board being soldered to the latter for its connections, notably for its electrical power supply connections.

FIGS. 1 and 2 show a main external electrical power supply connection 9 to the integrated circuit 1, this connection 9 being connected to the two electrical power supply terminals 2a, 2b of the first power supply system 2 of the integrated circuit 1. The connection 9 comprises a connection between the +ve pole of a battery, as power supply source external to the integrated circuit, with the positive terminal 2a of the first electrical power supply system 2 and a connection between the ground terminal 2b of the first electrical power supply system 2 with the earth referenced T in the figures.

The two connections of the main external connection 9 comprise means for contact 9a, 9b respectively with the positive terminal 2a and the ground terminal 2b of the first electrical power supply system 2. These contact means 9a, 9b usually take the form of solder joints.

The integrated circuit 1 comprises inputs 6 and outputs 7 for its connection with other elements mounted on an electronic board or external to an electronic board. In the figures, three inputs 6 and three outputs 7 are shown, which is non-limiting.

As previously mentioned, the aim of the invention is notably to test a component of the integrated circuit type 1, notably, but not limited to, an application-specific integrated circuit 1, directly on its original board without having to remove it hence avoiding heating it during the unsoldering operation and isolating the integrated circuit 1 from the rest of the electronic board. This original board may comprise elements other than the integrated circuit.

With reference to FIG. 2, according to the invention, the integrated circuit 1 comprises two pins 3a, 3b, respectively positive and ground, forming part of a second electrical power supply system 3 providing an auxiliary electrical connection of the circuit with the outside.

An auxiliary external connection 10 is connected to the two pins 3a, 3b forming part of the second electrical power supply system 3, internal to the integrated circuit 1, the pins 3*a*, 3*b* being disposed on the periphery of the integrated circuit 1.

The auxiliary external connection 10 is principally, but not exclusively, used for the implementation of a diagnostic or test operation on the integrated circuit. In this case, the second electrical power supply system 3 is advantageously connected to a stimulation pulse generator sending the stimulation pulses to the integrated circuit 1 via the second electrical power supply system 3 in order to perform a test on the integrated circuit 1. This will be described in more detail hereinbelow.

If the two electrical power supply terminals 2*a*, 2*b* of the first power supply system 2 of the integrated circuit 1 are physically connected to an electronic board accommodating the integrated circuit 1, the two pins 3*a*, 3*b* forming part of the second electrical power supply system 3 are not necessarily physically connected to the electronic board but may be connected indirectly such as for example in the form of connecting lugs or an equivalent arrangement.

The second electrical power supply system 3 is shown in parallel with the first power supply system 2 and in opposition, in other words the first power supply system 2 is open not allowing any current to flow when the second power supply system 3 is closed allowing a current to flow and vice versa.

In FIG. 2, the second electrical power supply system 3 is connected to an auxiliary external connection 10. It is this second electrical power supply system 3 that may be designed to be connected to a testing apparatus generating stimulation pulses and sending them to the integrated circuit 1. During the test, the main electrical power supply of the integrated circuit 1 is not enabled, the first electrical power supply system 2 being open, whereas the second power supply system 3 is closed and receives the stimulation pulses generated by the testing apparatus.

The auxiliary external circuit 10 preferably therefore forms part of the testing apparatus 120 connecting the integrated circuit 1 to a stimulation pulse generator. It is however to be considered that this auxiliary external circuit 10 may have another function, for example it may be an external backup circuit for the power supply of the integrated circuit 1.

Generally speaking, each terminal or pin of the first and second electrical power supply systems 2, 3 may be connected to the rest of the system to which it belongs via a respective electrical connection comprising a micro-switch 4*a*, 4*b*; 5*a*, 5*b*.

As the electrical power supply systems 2, 3 do not stay open or closed simultaneously, the micro-switches 4*a*, 4*b* of the first system 2 are in the open position when the micro-switches 5*a*, 5*b* of the second system 3 are in the closed position and vice versa.

In order to trigger the opening and the closing of the micro-switches 4*a*, 4*b*; 5*a*, 5*b*, the integrated circuit 1 possesses detection means allowing it to identify whether the integrated circuit 1 is in test mode, in which case the second electrical power supply system 3 is closed by closing its micro-switches 5*a*, 5*b* and the first system 1 is opened by opening micro-switches 4*a*, 4*b*.

The detection means can detect a normal operation of the integrated circuit 1 with, in this case, the first electrical power supply system 2 closed by closing its micro-switches 4*a*, 4*b* and the second system 3 opened by opening its micro-switches 5*a*, 5*b*.

In one preferred embodiment of the present invention, the integrated circuit 1 can be equipped with a voltage detector 100 configured to detect a voltage on the pins 3*a*, 3*b* of the second electrical power supply system 3. It is then also equipped with one or more processors 101 configured to set the micro-switches 4*a*, 4*b* of the first electrical power supply system 2 to the open position as soon as a voltage is detected on the pins 3*a*, 3*b* of the second electrical power supply system 3.

The converse applies for the micro-switches 5*a*, 5*b* of the second power supply system 3 which are opened whenever an absence of electrical contact to the second power supply system 3 is detected and closed whenever a contact to the second power supply system 3 is detected. Such a voltage on the pins 3*a*, 3*b* of the second electrical power supply system 3 means that a test of the integrated circuit 1 will take place.

In another preferred embodiment of the present invention which may be combined with the first one, the integrated circuit 1 can be equipped with a voltage detector 100 configured to detect a voltage on the terminals 2*a*, 2*b* of the first electrical power supply system 2, with one or more processors 101 configured to set the micro-switches 5*a*, 5*b* of the second electrical power supply system 3 to the open position and to set the micro-switches 4*a*, 4*b* of the first electrical power supply system 2 to the closed position as soon as a voltage is detected across the terminals 2*a*, 2*b* of the first electrical power supply system 2.

The invention also relates to an electronic board, being noteworthy in that it comprises at least one such integrated circuit 1. This electronic board may carry electronic elements other than the integrated circuit 1. In order to avoid undesirable power supply connections between the test electrical power supply and the electrical power supply for the electronic board, the electrical power supply for the electronic board incorporating the integrated circuit, advantageously soldered to it, may be disconnected from its power supply system when the board is not powered. Indeed, without taking this disconnection measure, a connection between test and the board power supplies could still be possible via one or various passive components that may be present on the board.

In an electronic board incorporating such an integrated circuit 1, it could also have been possible to place micro-switches 4*a*, 4*b*; 5*a*, 5*b* externally to the integrated circuit 1 within the electrical connections before the respective terminals 2*a*, 2*b* or pins 3*a*, 3*b* of the first and second electrical power supply systems 2, 3. This is not however a preferred solution.

In this case, the means for detecting a voltage on the pins 3*a*, 3*b* of the second electrical power supply system 3 and the means for setting the micro-switches 4*a*, 4*b* of the first electrical power supply system 2 in the open position in the first preferred embodiment described previously may be external to the integrated circuit 1. The same goes for the means for detecting an electrical contact to the pins 3*a*, 3*b* of the second electrical power supply system 3 and for the means setting the position of the micro-switches 5*a*, 5*b* of the second electrical power supply system 3 so as to close these micro-switches 5*a*, 5*b*.

The aim of equipping an integrated circuit 1 with a second electrical power supply system 3 is essentially to be able to carry out a test on the integrated circuit 1 without having to use the first power supply system 2, which would for example require the unsoldering of its external electrical power supply for normal operation so as to effect the connection to a testing apparatus sending stimulation pulses to it.

The steps will now be detailed of a method for testing an integrated circuit with more particular reference to FIG. 3 while considering FIGS. 1 and 2 for the numerical references not illustrated in FIG. 3.

The step referenced 11 symbolizes the start of the use of an integrated circuit 1. In normal operation, hence without implementation of a test process, the two electrical power supply terminals 2a, 2b, respectively positive and ground, forming part of a first power supply system 2, are electrically powered using an electrical power supply source external to the integrated circuit 1, it being given that their associated micro-switches 4a, 4b are closed. This is shown at the step 12. Simultaneously, the micro-switches 5a, 5b of the second electrical power supply system 3 are in the open position. This is shown at the step 13.

If no voltage is detected on the pins 3a, 3b of the second electrical power supply system 3, which is symbolized by the branch N, the closed state of the micro-switches 4a, 4b of the first power supply system 2 and the open state of the micro-switches 5a, 5b of the second power supply system 3 are maintained.

On the other hand, as soon as a voltage is detected on the pins 3a, 3b of the second electrical power supply system 3, which is symbolized by the response Y indicating a 'yes' to this question 14, the operations are carried out for opening the micro-switches 4a, 4b of the first power supply system 2, according to the step 15, and for closing the micro-switches 5a, 5b of the second electrical power supply system 3, according to the step 16.

If a voltage is detected on the terminals 2a, 2b of the first electrical power supply system 2, which is symbolized by the branch Y going from the question 17, the steps 12 and 13 are repeated, in other words the micro-switches 4a, 4b of the first power supply system 2 are closed and the micro-switches 5a, 5b of the second power supply system 3 are opened.

For as long as no voltage is detected across the terminals 2a, 2b of the first electrical power supply system 2, which is symbolized by the branch N going from the question 17, the closed state of the micro-switches 5a, 5b of the second power supply system 3 and, as a consequence, the open state of the micro-switches 4a, 4b first power supply system 2 persist.

Subsequently, at the question 18, if the response is 'yes' Y, namely if a voltage is detected on the pins 3a, 3b of the second electrical power supply system 3, this implies that the test is still in progress and that the steps 15 and 16 are being repeated.

As it is possible that the pins 3a, 3b of the second electrical power supply system 3 are powered by electrical pulses leaving an interval of time between them, it is possible to consider a latency time below which a detection of a zero voltage on the pins 3a, 3b of the second power supply system 3 is not taken into account.

At this question 18, if the response is 'no' N, namely that no voltage is detected on the pins 3a, 3b of the second electrical power supply system 3, this means that the test operation is finished. This has then reached the end of the method for testing an integrated circuit 1 symbolized by 19.

According to one method for testing such an integrated circuit 1 or an integrated circuit 1 accommodated in an electronic board conforming to the present invention, test stimulation pulses are sent by a testing apparatus to the integrated circuit 1. For this purpose, the testing apparatus is electrically connected to the integrated circuit 1 during the test via the second electrical power supply system 3 held in the closed position parallel to the first power supply system 2, the first power supply system 2 being open during the test.

In one advantageous embodiment, the method comprises the step for connection of a testing apparatus to the pins 3a, 3b, respectively positive and ground, of the second electrical power supply system 3. Simultaneously, the opening of the first electrical power supply system 2 and the closing of the second electrical power supply system 3 is effected as soon as this connection is made.

The method subsequently comprises the step for implementing the test by sending stimulation pulses from the testing apparatus to the integrated circuit 1 via the second electrical power supply system 3. This performs the test per se in order to discover whether the integrated circuit 1 is operating correctly or not.

After completion of the test, the opening of the second electrical power supply system 3 and the closing of the first electrical power supply system 2 are effected, this being carried out either simultaneously or just prior or just after the disconnection of the testing apparatus from the pins 3a, 3b, respectively positive and ground, of the second electrical power supply system 3. The closing of the first power supply system 2 following the disconnection of the testing apparatus from the pins 3a, 3b is preferred.

The invention also relates to a test device for the implementation of such a method. Conventionally, the test device comprises a stimulation pulse generator sending the stimulation pulses to the integrated circuit 1, means for receiving the responses from the integrated circuit 1 following the stimulation pulses and means 10a, 10b for electrical contact with each terminal 3a, 3b of the second electrical power supply system 3 of the integrated circuit and referenced on a test power supply.

The electrical contact means 10a, 10b may take the form of a readily removable contact mechanism carried by the apparatus that can be positioned on each pin 3a, 3b. Indeed, in one preferred embodiment of the invention, the contact between the second electrical power supply system 3 and the auxiliary external connection 10 is only temporary, for example only lasting for the time of a test of the integrated circuit. It is therefore advantageous for the electrical contact means 10a, 10b to be readily removable.

Preferably, each contact mechanism can take the form of a clip equipped with two jaws gripping between them a respective pin 3a, 3b of the second electrical power supply system 3 of the integrated circuit 1. As an alternative, the electrical contact means 10a, 10b may take the form of a wire soldered to each pin 3a, 3b and connected to the pulse generator.

The invention claimed is:

1. An integrated circuit comprising:
two electrical power supply terminals, respectively positive and ground, forming part of a main electrical power supply system internal to the integrated circuit and providing a main electrical power supply by connecting with an electrical power supply source external to the integrated circuit through a main external electrical power supply connection, the positive terminal of the main electrical power supply system being configured to connect with the external electrical power supply source through a first contact of the main external electrical power supply connection, the ground terminal of the first electrical power supply system being configured to connect with ground through a second contact of the main external electrical power supply connection; and
two pins, respectively positive and ground, forming part of a diagnostic system internal to the integrated circuit to provide an auxiliary electrical power, the diagnostic system being in parallel with the main electrical power system and alternately closed when the main electrical power system is open, the diagnostic system being configured to connect to a testing apparatus such that stimulation pulses from the testing apparatus are able to be received at the integrated circuit, wherein, during testing of the integrated circuit, the main power supply system is open such that no current is allowed to flow and the main electrical power supply of the integrated circuit is not enabled and the diagnostic system is closed such that the stimulation pulses generated by the testing apparatus are received at the diagnostic system, and when the testing of the integrated circuit is not being implemented, the diagnostic system is open such that no current is allowed to flow and the main power supply system is closed such that current is allowed to flow.

2. The integrated circuit according to claim 1, further comprising a plurality of micro-switches of the main power supply system and the diagnostic system, the micro-switches of the main power supply system being in the open position when the micro-switches of the diagnostic system are in the closed position and the micro-switches of the diagnostic system being in the open position when the micro-switches of the main power supply system are in the closed position.

3. The integrated circuit according to claim 2, further comprising:
    a voltage detector configured to detect a voltage on the pins of the diagnostic system; and
    one or more processors configured to set the micro-switches of the main power supply system to the open position and set the micro-switches of the diagnostic system to the closed position as soon as a voltage is detected on the pins of the diagnostic system.

4. The integrated circuit according to claim 3, further comprising:
    a voltage detector configured to detect a voltage across the terminals of the main electrical power supply system; and
    one or more processors configured to set the micro-switches of the diagnostic system to the open position and set the micro-switches of the main electrical power supply system to the closed position as soon as a voltage is detected across the terminals of the main electrical power supply system.

5. An electronic board comprising:
    the at least one integrated circuit according to claim 3.

6. A method for testing the integrated circuit according to claim 5, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

7. A method for testing the integrated circuit according to claim 3, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

8. The integrated circuit according to claim 2, further comprising:
    a voltage detector configured to detect a voltage across the terminals of the main electrical power supply system; and
    one or more processors configured to set the micro-switches of the diagnostic system to the open position and set the micro-switches of the main power supply system to the closed position as soon as a voltage is detected across the terminals of the main power supply system.

9. An electronic board comprising:
    the at least one integrated circuit according to claim 8.

10. A method for testing the integrated circuit according to claim 8, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

11. An electronic board comprising:
    the at least one integrated circuit according to claim 2.

12. A method for testing the integrated circuit according to claim 11, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

13. A method for testing the integrated circuit according to claim 2, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

14. An electronic board comprising:
    the at least one integrated circuit according to claim 1.

15. A method for testing the integrated circuit according to claim 14, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

16. A method for testing the integrated circuit according to claim 1, the method comprising:
    sending the test stimulation pulses by the testing apparatus to the integrated circuit, the testing apparatus being electrically connected to the integrated circuit during the test,
    wherein the testing apparatus is electrically connected to the integrated circuit by the diagnostic system when the main power supply system is maintained in the open position.

17. The method according to claim 16, further comprising:
- connecting the testing apparatus to the pins, that are respectively positive and ground, of the diagnostic system;
- opening the main electrical power supply system and closing the diagnostic system as soon as the connecting occurs;
- implementing the test by sending the stimulation pulses from the testing apparatus to the integrated circuit via the second electrical power supply system;
- after completion of the test, opening the diagnostic system;
- disconnecting the testing apparatus from the pins, that are respectively positive and ground, of the diagnostic system; and
- closing the main electrical power supply system.

18. A test device for the implementation of the method according to claim 17, the device comprising:
- a stimulation pulse generator sending the stimulation pulses to the integrated circuit;
- a receiver configured to receive responses from the integrated circuit following the stimulation pulses; and
- one or more electrical contact mechanisms carried by the testing apparatus positioning itself on each of the pins or of a wire soldered to each of the pins and connected to the pulse generator.

19. The test device according to claim 18, wherein each of the contact mechanisms is a clip equipped with two jaws gripping a respective one of the pins of the diagnostic system of the integrated circuit between the two jaws.

20. An integrated circuit comprising:
- two electrical power supply terminals, respectively positive and ground, forming part of a first electrical power supply system internal to the integrated circuit and providing a main electrical power supply by connecting with an electrical power supply source external to the integrated circuit through a main external electrical power supply connection, the positive terminal of the first electrical power supply system being configured to connect with the external electrical power supply source through a first contact of the main external electrical power supply connection, the ground terminal of the first electrical power supply system being configured to connect with ground through a second contact of the main external electrical power supply connection; and
- two pins, respectively positive and ground, forming part of a second electrical power supply system internal to the integrated circuit and configured to connect to an auxiliary external circuit that is a backup circuit for power supply of the integrated circuit and configured to receive current therethrough, the two pins providing an auxiliary electrical connection of the integrated circuit with the outside, wherein,
- when the first power supply system is open such that no current is allowed to flow and the main electrical power supply of the integrated circuit is not enabled, the second power supply system is closed such that the auxiliary external circuit acts as the backup circuit for power supply of the integrated circuit, and
- when the second power supply system is open such that no current is allowed to flow, the first power supply system is closed such that current is allowed to flow and the main electrical power supply of the integrated circuit is enabled.

* * * * *